(12) United States Patent
Odagawa et al.

(10) Patent No.: US 8,927,095 B2
(45) Date of Patent: Jan. 6, 2015

(54) METHOD FOR PRODUCING THIN OXIDIZED CARBON FILM, ELEMENT HAVING THIN OXIDIZED CARBON FILM, AND METHOD FOR PRODUCING SAME

(71) Applicant: Panasonic Corporation, Osaka (JP)

(72) Inventors: Akihiro Odagawa, Osaka (JP); Nozomu Matsukawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/156,293

(22) Filed: Jan. 15, 2014

(65) Prior Publication Data

US 2014/0134409 A1    May 15, 2014

Related U.S. Application Data

(63) Continuation of application No. PCT/JP2012/004364, filed on Jul. 5, 2012.

(30) Foreign Application Priority Data

Jul. 21, 2011  (JP) ................................. 2011-159659

(51) Int. Cl.
| | |
|---|---|
| *B32B 3/00* | (2006.01) |
| *H01B 3/00* | (2006.01) |
| *C01B 31/04* | (2006.01) |
| *C01B 31/02* | (2006.01) |
| *H01L 29/786* | (2006.01) |
| *H01L 29/161* | (2006.01) |
| *H01L 29/66* | (2006.01) |
| *H01B 13/18* | (2006.01) |

(52) U.S. Cl.
CPC ............ *H01B 3/004* (2013.01); *C01B 31/0446* (2013.01); *C01B 31/02* (2013.01); *H01L 29/786* (2013.01); *H01L 29/161* (2013.01); *H01L 29/66742* (2013.01); *H01L 29/78684* (2013.01); *C01B 31/043* (2013.01); *H01B 13/18* (2013.01)
USPC ..................................... 428/195.1; 423/415.1

(58) Field of Classification Search
CPC .... C01B 31/00; C01B 31/043; C01B 31/0446
USPC ......................................................... 428/195.1
See application file for complete search history.

(56) References Cited

U.S. PATENT DOCUMENTS

| | | | | |
|---|---|---|---|---|
| 8,722,430 | B2 * | 5/2014 | Odagawa et al. | 438/3 |
| 2013/0001089 | A1 * | 1/2013 | Li et al. | 205/106 |

(Continued)

FOREIGN PATENT DOCUMENTS

| | | |
|---|---|---|
| JP | 2009-182173 A | 8/2009 |
| WO | 2012-070218 A1 | 5/2012 |

OTHER PUBLICATIONS

Masubuchi, S., et al.: "Fabrication of graphene nanoribbon by local anodic oxidation lithography using atomic force microscope", Applied Physics Letters, vol. 94, pp. 082107-1-082107-3, 2009.

(Continued)

*Primary Examiner* — Elizabeth Mulvaney
(74) *Attorney, Agent, or Firm* — McDermott Will & Emery LLP

(57) ABSTRACT

A method for producing a thin oxidized carbon film according to the present disclosure includes: a first step of preparing a thin carbon film and a copper oxide being in contact with the thin carbon film and containing a mixture of $Cu_2O$ and $CuO$; and a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into an oxidized portion composed of oxidized carbon so as to form a thin oxidized carbon film having the oxidized portion.

7 Claims, 10 Drawing Sheets

(56) References Cited

U.S. PATENT DOCUMENTS

2013/0023070 A1 1/2013 Odagawa et al.
2014/0255500 A1* 9/2014 Son et al. .................... 424/490

OTHER PUBLICATIONS

Machida, Tomoki: "Fabrication of Graphene Quantum Dots Using Scanning Probe Microscope Lithography", Annual Report of the Murata Science Foundation, No. 24, pp. 434-439, 2010.

Novoselov, K.S., et al.: "Electric Field Effect in Atomically Thin Carbon Films", Science, vol. 306, pp. 666-669, 2004.

Jin, Meihua, et al.: "Graphene oxide thin film field effect transistors without reduction", Journal of Physics D: Applied Physics, vol. 42, No. 13, pp. 135109-1-135109-5, 2009.

Kwon, Sangku, et al.: "Reversible bistability of conductance on graphene/CuOx/Cu nanojunction", Applied Physics Letters, vol. 100, pp. 123101-1-123101-4, 2012.

Li, Xiaolin, et al.: "Chemically Derived, Ultrasmooth Graphene Nanoribbon Semiconductors", Science, vol. 319, pp. 1229-1232, 2008.

International Search Report issued in PCT/JP2012/004364, dated Aug. 14, 2012, with English translation, 4 pages.

* cited by examiner

Number of times Np of electrical pulse application

US 8,927,095 B2

METHOD FOR PRODUCING THIN OXIDIZED CARBON FILM, ELEMENT HAVING THIN OXIDIZED CARBON FILM, AND METHOD FOR PRODUCING SAME

This is a continuation of International Application No. PCT/JP2012/004364, with an international filing date of Jul. 5, 2012, which claims the foreign priority of Japanese Patent Application No. 2011-159659, filed on Jul. 21, 2011, the entire contents of both of which are hereby incorporated by reference.

BACKGROUND OF THE INVENTION

1. Field of the Invention

The present disclosure relates to a method for producing a thin oxidized carbon film that is a thin carbon film having an oxidized portion composed of oxidized carbon. The present disclosure also relates to an element having a thin oxidized carbon film, and a method for producing the element.

2. Description of Related Art

Substances made of carbon (C) take a wide variety of forms including, as well as diamonds, sheets, nanotubes, horns, and balls such as $C_{60}$ fullerene. Furthermore, the physical properties of such substances are more various than their forms. The rich variety of physical properties prompts energetic research and development for application of the substances. Thin carbon films are one of the substances made of carbon. Among them, a thin carbon film composed of one or several carbon atom layers in which carbon atoms are $sp^2$-bonded is called graphene. Graphene is a substance the isolation of which was realized in 2004, and its singular physical properties as a two-dimensional semimetal have been discovered one after another (Science, vol. 306, pp. 666-669 (2004)). Graphene has a singular band structure in which two π bands having linear band dispersion intersect at the Fermi energy. For this reason, it is expected that the carrier (electrons and holes) mobility in graphene should be ten or more times the carrier mobility in silicon (Si). There is a possibility that a high-speed and low-consumption electronic device can be realized by use of graphene.

In the case where graphene is used in an electronic device (e.g., a field-effect device such as a transistor), the considerably high electrical conductivity of graphene may need to be reduced. JP 2009-182173 A and Science, vol. 319, pp. 1229-1232 (2008) disclose that when the width of graphene in a direction perpendicular to a travel direction of carriers is reduced to several nanometers to several tens of nanometers, one-dimensional quantum confinement effect is created in the section of graphene that has such a width as indicated above, and that this section of graphene can be used, by virtue of the effect, as a semiconductor having an energy gap in the range of about sub-eV to several eV.

JP 2009-182173 A and Science, vol. 306, pp. 666-669 (2004) disclose methods for patterning graphene into a fine pattern by electron beam lithography and by dry etching using oxygen plasma. Science, vol. 319, pp. 1229-1232 (2008) discloses a fine processing method for forming graphene into a ribbon shape using ultrasonic wave, and also discloses that the ribbon-shaped graphene exhibits semiconductor properties. Applied Physics Letters, vol. 94, 082107 (2009) discloses fine processing of graphene by anodic oxidation using a needle of an atomic force microscope (AFM).

SUMMARY OF THE INVENTION

Graphene is a sheet having an atomic-level thickness, and it is not easy to process graphene into a form having a small width as disclosed in JP 2009-182173 A and Science, vol. 319, pp. 1229-1232 (2008).

One non-limiting and exemplary embodiment provides a method capable of forming a nanometer-order pattern on a thin carbon film such as graphene, the method being widely applicable as a process technique for producing electronic devices.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a method for producing a thin oxidized carbon film, the method includes: a first step of preparing a thin carbon film and a copper oxide being in contact with the thin carbon film and containing a mixture of $Cu_2O$ and $CuO$; and a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into an oxidized portion composed of oxidized carbon so as to form a thin oxidized carbon film having the oxidized portion.

The method for producing a thin oxidized carbon film according to the present disclosure is a method capable of forming a nanometer-order pattern on a thin carbon film such as graphene, and is widely applicable as a process technique for producing electronic devices.

These general and specific aspects may be implemented using a system, a method, a computer program, and any combination of systems, methods, and computer programs.

DETAILED DESCRIPTION

Figure 1:
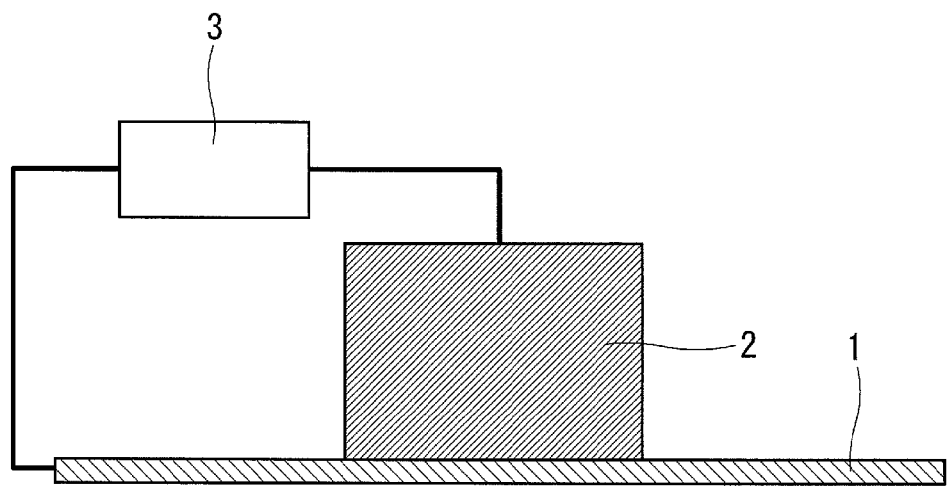
FIG. 1 is a schematic diagram showing an example of a configuration including a thin carbon film and a copper oxide and designed to carry out the method for producing a thin oxidized carbon film according to the present disclosure.

Science, vol. 306, pp. 666-669 (2004) merely discloses fine processing on a size scale of about several hundreds of nanometers.

JP 2009-182173 A discloses fine processing on a size scale of several nanometers. In this fine processing, however, a wet process such as application and peeling of a resist is carried out, and a dry process such as plasma treatment which causes severe damage to a thin film is also carried out. Therefore, the edge portion of the formed pattern is thought to exert a significant influence on the device characteristics, and reliable nanometer-order fine processing of graphene is difficult. In addition, the fine processing disclosed in JP 2009-182173 A is costly, and the apparatus for implementing the processing is also expensive.

With the method of Science, vol. 319, pp. 1229-1232 (2008), it is difficult to perform fine processing of a targeted portion of graphene.

In the method of Applied Physics Letters, vol. 94, 082107 (2009), the processing capacity per unit time (throughput) is low. In addition, this method requires carrying out processing of graphene in an atmosphere containing moisture. Therefore, this method has poor compatibility with semiconductor processes.

These conventional methods are not capable of forming a nanometer-order pattern on a thin carbon film such as graphene, and/or are difficult to widely apply as process techniques for producing electronic devices.

When forming a nanometer-order pattern on a thin carbon film, the present inventors did not employ fine processing, such as plasma treatment of the thin carbon film, in which only a portion of the thin film is allowed to remain and the rest of the thin film is removed. In the method for producing a thin oxidized carbon film according to the present disclosure, an oxidized portion composed of oxidized carbon is formed in a thin carbon film by application of an electrical bias via a copper oxide, and the thin film is thus converted into a thin oxidized carbon film. There is a difference in physical properties, typically in electrical conductivity, between the oxidized portion and the remaining portion (the portion composed of carbon) in the thin oxidized carbon film. The oxidized portion has insulating properties, while the remaining portion may exhibit electrical conductivity or exhibit properties as a semiconductor depending on its shape and size. The copper oxide can be formed in a nanometer-order pattern on the thin carbon film by use of a thin film formation technique. That is, with the method for producing a thin oxidized carbon film according to the present disclosure, a nanometer-order pattern defined by properties can be formed in the thin carbon film such as graphene. In addition, the pattern formation does not require removing a portion of the thin carbon film by a technique, such as plasma treatment, which causes severe damage to the thin film. Therefore, damage to the formed pattern is reduced. Furthermore, the method for producing a thin oxidized carbon film according to the present disclosure has good compatibility with semiconductor processes. That is, the production method is a method capable of forming a nanometer-order pattern on a thin carbon film such as graphene, and is widely applicable as a process technique for producing electronic devices. An applied example is a method for producing an element having a thin oxidized carbon film. An example of a product obtained by the applied method is an element having a thin oxidized carbon film.

In the present disclosure, a thin carbon film that is entirely or partially formed of an oxidized portion composed of oxidized carbon is referred to as a "thin oxidized carbon film". In other words, the thin oxidized carbon film in the present disclosure is not necessarily composed of only oxidized carbon, but may have a portion composed of carbon.

A first aspect of the present disclosure provides a method for producing a thin oxidized carbon film, the method including: a first step of preparing a thin carbon film and a copper oxide being in contact with the thin carbon film and containing a mixture of $Cu_2O$ and $CuO$; and a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into an oxidized portion composed of oxidized carbon so as to form a thin oxidized carbon film having the oxidized portion.

A second aspect provides the method for producing a thin oxidized carbon film as set forth in the first aspect, wherein the thin carbon film is single-layer graphene or multi-layer graphene.

A third aspect provides the method for producing a thin oxidized carbon film as set forth in the first or second aspect, wherein, in the second step, a pulse voltage or a pulse current is applied between the thin carbon film and the copper oxide.

A fourth aspect provides the method for producing a thin oxidized carbon film as set forth in any one of the first to third aspects, wherein the second step includes: a first sub-step of applying the voltage or the current between the thin carbon film and the copper oxide; a second sub-step of detecting an electrical signal containing information on an electrical resistance value of the contact area of the thin carbon film with the copper oxide; and a third sub-step of verifying whether the detected electrical signal is an electrical signal that is to be obtained when the electrical resistance value has reached a predetermined value.

A fifth aspect provides the method for producing a thin oxidized carbon film as set forth in the fourth aspect, wherein the first sub-step, the second sub-step, and the third sub-step are repeated in this order in the second step until the detected electrical signal is determined as the electrical signal that is to be obtained when the electrical resistance value has reached the predetermined value.

A sixth aspect provides a method for producing an element having a thin oxidized carbon film, the element including a substrate and a thin oxidized carbon film disposed on the substrate and having an oxidized portion composed of oxidized carbon, the method including: a first step of preparing the substrate, a thin carbon film disposed on the substrate, and a copper oxide containing a mixture of $Cu_2O$ and $CuO$, in such a manner that the copper oxide is in contact with the thin carbon film at a position where the oxidized portion is to be formed in the thin carbon film; and a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into the oxidized portion so as to form a thin oxidized carbon film having the oxidized portion.

A seventh aspect provides an element having a thin oxidized carbon film, the element including: a substrate composed of a conductor or a semiconductor; a thin oxidized carbon film disposed on the substrate and having an insulating portion composed of oxidized carbon and a non-insulating portion composed of carbon; an insulating layer disposed between the substrate and the thin oxidized carbon film; and a copper oxide containing a mixture of $Cu_2O$ and $CuO$ and disposed on a surface of the thin oxidized carbon film that is opposite to a surface facing the insulating layer, the copper oxide being in contact with the insulating portion. The non-insulating portion has a narrow portion bounded by the insulating portion when viewed in a direction perpendicular to a principal surface of the thin oxidized carbon film, and an electrical conductivity of the non-insulating portion via the narrow portion in an in-plane direction of the thin oxidized carbon film is variable by application of an electrical field between the substrate and the thin oxidized carbon film.

Hereinafter, specific embodiments will be described. The present disclosure is not limited by the specific embodiments and examples presented below.

Figure 2:
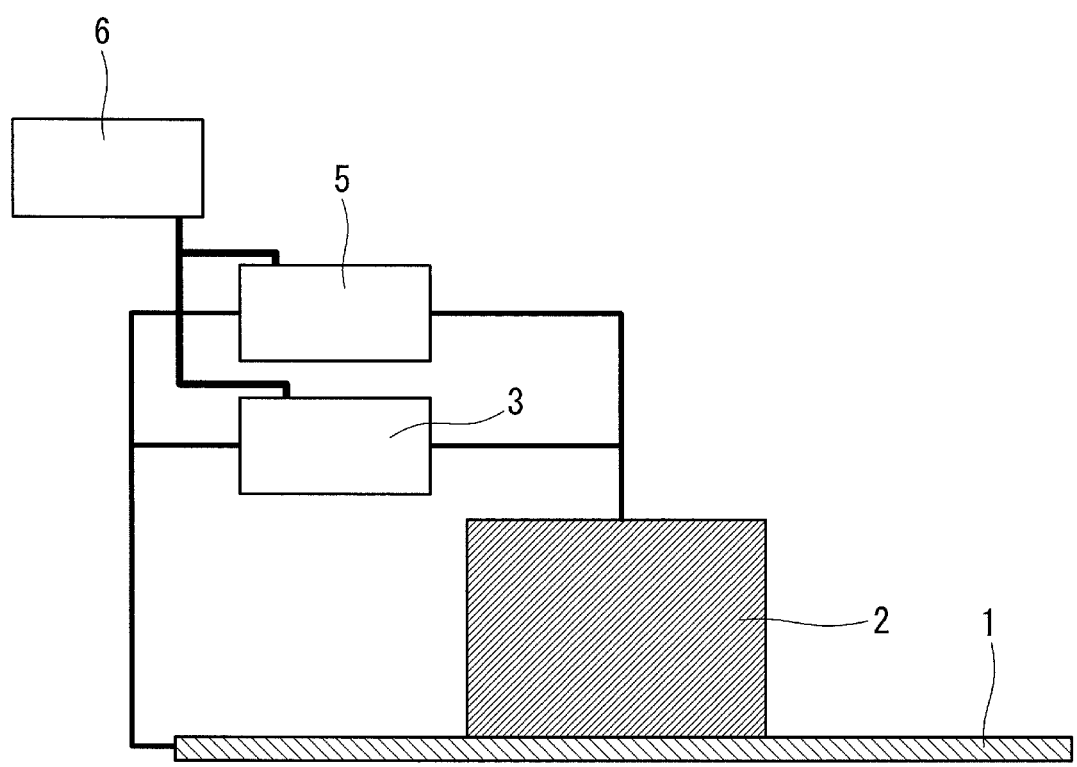
FIG. 2 is a schematic diagram showing another example of a configuration including a thin carbon film and a copper oxide and designed to carry out the method for producing a thin oxidized carbon film according to the present disclosure.
Figure 3:
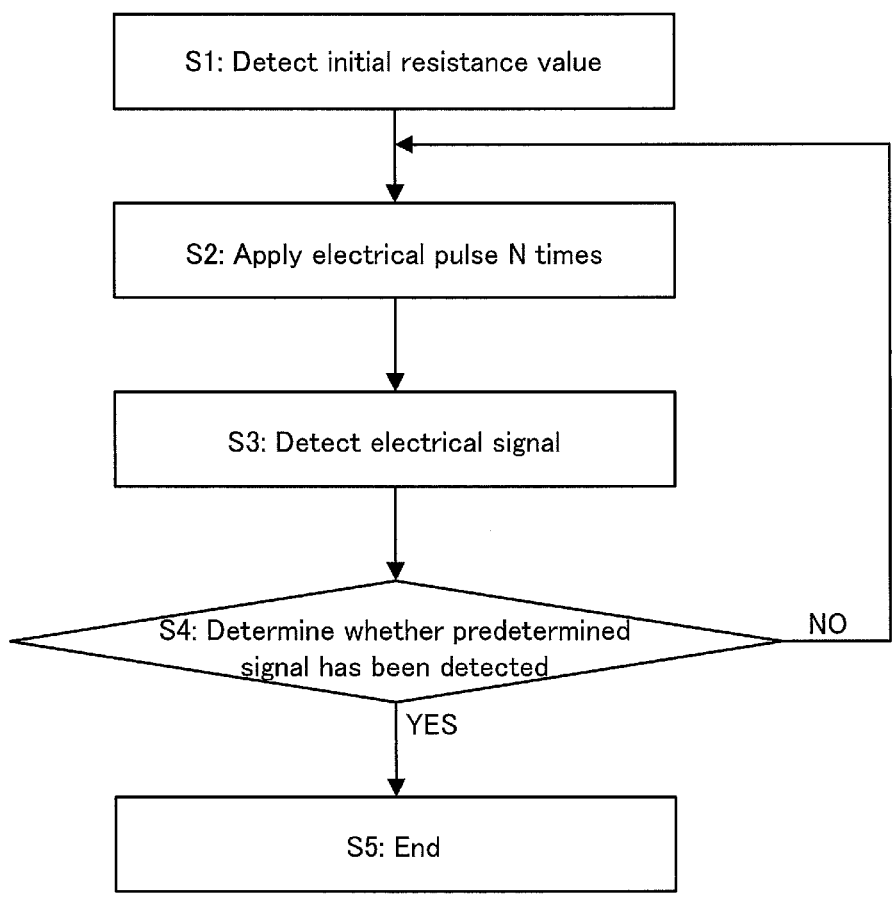
FIG. 3 is a diagram showing an example of a flowchart for the case where the method for producing a thin oxidized carbon film according to the present disclosure is carried out using the configuration shown in FIG. 2.

The method for producing a thin oxidized carbon film according to the present disclosure can be carried out, for example, by the embodiment shown in FIG. 1 or FIG. 2 in accordance with the flowchart shown in FIG. 3.

First, a thin carbon film 1 and a copper oxide 2 disposed on and in contact with the thin carbon film 1 are prepared as shown in FIG. 1 (first step). A bias applying unit 3 is electrically connected to the thin carbon film 1 and the copper oxide 2. The thin carbon film 1, the copper oxide 2, and the bias applying unit 3 form an electrical circuit. Next, an electrical bias (a bias voltage or a bias current) is applied between the thin carbon film 1 and the copper oxide 2 by the bias applying unit 3, with the electrical potential of the thin carbon film being positive relative to that of the copper oxide 2 (second step).

The thin carbon film 1 is a thin film that has a layer of $sp^2$-bonded carbon atoms (hereinafter, simply referred to as a "carbon atom layer"). The carbon atom layer is composed of a two-dimensional network of carbon atoms. Each of the carbon atoms constituting the carbon atom layer has four electrons. Three of the four electrons participate in formation of $\sigma$ (sigma) bonds, and the remaining one electron participates in formation of a weak $\pi$ (pi) bond shared between carbon atoms. Therefore, the thin carbon film having such a carbon atom layer has high electrical conductivity. However, upon oxidation, some of the $sp^2$-bonds in the carbon atom layer are converted into spa-bonds, in which all of the four electrons are used for $\sigma$ bonds. Therefore, a band formed by $\pi$ bonds on a Fermi surface disappears from an oxidized portion of the thin carbon film 1 that has been formed by oxidation, and the oxidized portion acts as an insulating portion.

In the patterning of the present disclosure, the formation of the insulating portion by oxidation is utilized. More specifically, the copper oxide 2 is deposited on the thin carbon film 1, an electrical field is applied between the copper oxide 2 and the thin carbon film 1, and thus the contact area of the thin carbon film 1 with the copper oxide 2 is oxidized. With this method, a process such as plasma treatment which causes severe damage to the thin carbon film can be omitted. Therefore, less damage is caused to the pattern (oxidized carbon/ carbon pattern, which can be regarded as, for example, insulation/non-insulation pattern in view of its properties) formed on the resultant thin oxidized carbon film. This contributes to improvement in the properties of an electronic device. In addition, this method has good compatibility with widely-used processes such as semiconductor processes. Furthermore, the copper oxide 2 can be deposited with great freedom of shape and size, and can be formed in a fine pattern of nanometer order as well as in a larger pattern of, for example, millimeter order. Therefore, with this method, patterning of the thin oxidized carbon film can be performed with great freedom of shape and size. As a matter of course, the copper oxide 2 may be deposited over the entire surface of the thin carbon film 1, the entire thin carbon film 1 may be oxidized, and a thin oxidized carbon film made entirely of oxidized carbon may be formed.

With the method for producing a thin oxidized carbon film according to the present disclosure, a thin carbon film having a patterned oxidized portion can be formed. The patterning can be performed on a part or the whole of the thin carbon film 1 in the plane direction, and can be performed on a part or the whole of the thin carbon film 1 in the thickness direction. However, when only a part of the film in the thickness direction is oxidized, the contact area of the thin carbon film with the copper oxide may not be converted into an insulating portion depending on the degree of oxidation. In the case where formation of an insulating portion needs to be ensured, such as when the thin oxidized carbon film formed is used for a field-effect device, the production method of the present disclosure is carried out, for example, in such a manner that the whole of the film in the thickness direction is converted into an oxidized portion. The patterning in the plane direction can be controlled, for example, by the shape and size of the copper oxide 2 deposited on the thin carbon film 1. The patterning in the thickness direction can be controlled, for example, by the intensity of the voltage or current applied between the thin carbon film 1 and the copper oxide 2 (the magnitude of the voltage or current and the application time).

The thin carbon film 1 is a thin film having a carbon atom layer. The thin carbon film 1 is, for example, graphene. The graphene is single-layer graphene composed of a single carbon atom layer or multi-layer graphene composed of several carbon atom layers. That is, the thin carbon film 1 may be single-layer graphene or multi-layer graphene. The graphene 1 can be obtained, for example, by exfoliation of a part of single-crystal graphite or highly oriented pyrolytic graphite (HOPG).

The copper oxide 2 includes a mixture of $Cu_2O$ and $CuO$ (e.g., a mixed polycrystal of $Cu_2O$ and $CuO$). The copper oxide 2 may consist of a mixture of $Cu_2O$ and $CuO$.

The shape of the copper oxide 2 is not particularly limited, as long as when an electrical bias is applied between the thin carbon film 1 and the copper oxide 2 with the electrical potential of the thin carbon film 1 being positive, the contact area of the thin carbon film 1 with the copper oxide 2 is oxidized and converted into an oxidized portion composed of oxidized carbon, and thus a thin oxidized carbon film having the oxidized portion is formed. The copper oxide 2 is, for example, in the form of a bulk, a sheet, a layer, or a particle.

The configuration of the bias applying unit 3 is not particularly limited as long as an electrical bias can be applied between the thin carbon film 1 and the copper oxide 2. The same can be said for the electrical connection of the bias applying unit 3 to the thin carbon film 1 and the copper oxide 2. The bias applying unit 3 can be built, for example, using a voltage source that applies a constant voltage, a battery, a pulse generator, or the like.

The electrical bias applied between the thin carbon film 1 and the copper oxide 2 is, for example, in the form of a pulse (an electrical pulse). That is, for example, a pulse voltage or current is applied between the thin carbon film 1 and the copper oxide 2 in the second step. In this case, for example, the pulse voltage or current is applied one or more times.

Although depending on the configurations of the thin carbon film 1 and the copper oxide 2, the value of the voltage or current applied between them is, for example, 0.05 V to 100 V in terms of voltage. The applied voltage or current may be varied or, for example, may be gradually increased, in conjunction with monitoring the process of formation of the oxidized portion in the thin carbon film 1. An applied voltage expected to allow formation of the oxidized portion is typically in the range of 0.1 V to 20 V. When the applied voltage or current is excessively high, insulation breakdown tends to occur in the oxidized portion even if the formation of the portion has been completed. When a pulse voltage or current is applied, the pulse width can be adjusted depending on the magnitude of the electrical bias to be applied, and is, for example, 100 ns to 1 s.

When a pulse voltage or current is applied, the number of times N of pulse application can be adjusted depending on the magnitude of the electrical bias to be applied and on the pulse width. When the number of times N is small (when the oxidized portion is formed by a small number of times of pulse application), the steps for carrying out the production method of the present disclosure are simplified. When the number of times N is large, the rate of oxidation by electrical bias application is slowed, and mechanical deterioration such as breakdown of the copper oxide 2 is prevented. Application of a pulse voltage or current enables stepwise formation of the oxidized portion. The pulse may be in the shape of a rectangle or a sine curve.

The applied voltage or current may be a constant electrical bias (e.g., a direct current (DC) bias). In this case, the application protocol of the electrical bias and the configuration of the bias applying unit 3 are simplified.

The application of the electrical bias to the thin carbon film 1 and the copper oxide 2 is performed, for example, until the oxidized portion is formed in the contact area of the thin carbon film 1 with the copper oxide 2, and then a predetermined electrical resistance value is achieved in the area (in the oxidized portion). For this purpose, the configuration shown in FIG. 2 can be used, for example. In the case where the electrical resistance value of the contact area of the thin carbon film 1 with the copper oxide 2 is sharply increased at some point during the electrical bias application, and is maintained at an approximately constant value after the completion of formation of the oxidized portion, the predetermined electrical resistance value can be set, for example, to the constant value. When it is difficult to directly detect the electrical resistance value of the area, whether the predetermined electrical resistance value has been achieved in the area may be determined, for example, by detection of the electrical resistance value of the electrical circuit including the area.

The configuration shown in FIG. 2 further includes a signal detecting unit 5 and a determination unit 6, in addition to the configuration shown in FIG. 1. The signal detecting unit 5 and the determination unit 6 are designed to detect a signal flowing in the electrical circuit composed of the thin carbon film 1, the copper oxide 2, and the bias applying unit 3. The signal detecting unit 5 and the determination unit 6 themselves may be included in the electrical circuit. The signal detecting unit 5 is electrically connected to the thin carbon film 1 and the copper oxide 2, and detects an electrical signal containing information on the electrical resistance value of the contact area of the thin carbon film 1 with the copper oxide 2. The information on the electrical resistance value is, for example, the electrical resistance value itself, and/or information on the amount of change in the electrical resistance value. The configuration of the signal detecting unit 5 is not particularly limited as long as the electrical signal containing the information on the electrical resistance value can be detected. The signal detecting unit 5 can be built using an ammeter, a voltmeter, a source meter, or the like. A semiconductor parameter analyzer can be used as the signal detecting unit 5. The determination unit 6 is connected to the bias applying unit 3 and the signal detecting unit 5. The determination unit 6 can be built using an information processing apparatus such as a personal computer (PC). With the configuration shown in FIG. 2, the thin oxidized carbon film can be formed in conjunction with detection of the electrical resistance value of the contact area of the thin carbon film 1 with the copper oxide 2 and/or the change in the electrical resistance value.

FIG. 3 shows an example of a flowchart for the case where a thin oxidized carbon film having an oxidized portion exhibiting a predetermined electrical resistance value is produced using the configuration shown in FIG. 2.

First, the signal detecting unit 5 detects an electrical resistance value of the circuit composed of the thin carbon film 1, the copper oxide 2, and the bias applying unit 3 before an electrical bias is applied (S1). This electrical resistance value contains information on the electrical resistance value exhibited by the contact area of the thin carbon film 1 with the copper oxide 2 before the electrical bias application. This electrical resistance value is an initial resistance value.

Next, the bias applying unit 3 applies an electrical bias (voltage or current) between the thin carbon film 1 and the copper oxide 2, with the electrical potential of the thin carbon film 1 being positive (S2). In the example shown in FIG. 3, an electrical bias in the form of a pulse (electrical pulse) is applied N times. The electrical bias applied between the thin carbon film 1 and the copper oxide 2 is not limited to a pulse form. For example, a direct current bias may be applied for a predetermined period of time.

The number of times the electrical pulse is applied in S2 can be adjusted based on the magnitude and pulse width of the electrical pulse. The number of times the electrical pulse is applied in S2, and the magnitude and pulse width of the electrical pulse may be adjusted based on the initial resistance value detected in S1. In S2 that is performed for the second and subsequent times when the determination "NO" is made in S4, the number of times the electrical pulse is applied in S2, and the magnitude and pulse width of the electrical pulse are adjusted, for example, based on the information detected in S3 as to the electrical resistance value of the circuit.

Next, the signal detecting unit 5 detects the electrical resistance value of the circuit as an electrical signal containing information on the electrical resistance value of the contact area of the thin carbon film 1 with the copper oxide 2 (S3).

Next, the determination unit 6 determines whether the electrical signal detected by the signal detecting unit 5 is a predetermined signal (S4). The determination is based on whether the electrical resistance value of the circuit has reached a predetermined threshold value. That is, the determination unit 6 verifies whether the detected signal is an electrical signal that is to be obtained when the electrical resistance value of the circuit has reached a predetermined value.

When the signal contains the electrical resistance value itself, the determination unit 6 determines, for example, whether the value is a predetermined electrical resistance value. When the signal is information on the change in the electrical resistance value, it is determined, for example, whether the amount of change in the electrical resistance value contained in the detected signal is equal to or smaller than a predetermined threshold value. This can be applied to the case where the change in the electrical resistance value caused by electrical bias application is reduced as a result of the predetermined electrical resistance value being reached.

The data (predetermined threshold value) used as a basis for determination may be stored in a storage section of the signal detecting unit 5 and/or a storage section of the determination unit 6. The data may be a single electrical signal (e.g., a single electrical resistance value), or may include a certain range of electrical signals (e.g., a range of electrical resistance values). The storage section can be composed of, for example, a storage device such as a RAM (random access memory) or a ROM (read-only memory).

When it is determined in S4 that the predetermined signal has been obtained (the predetermined electrical resistance value has been reached) (YES shown in FIG. 3), the production process is ended in accordance with the flowchart (S5). When it is determined that the predetermined signal has not been obtained (the predetermined electrical resistance value has not been achieved yet) (NO shown in FIG. 3), the production process returns to the step S2, and then S2, S3, and S4 are repeated until the determination "YES" is made in S4. The production process is ended, for example, by stoppage of electrical bias application.

That is, in the production method of the present disclosure, the second step may include: a first sub-step of applying a voltage or a current between the thin carbon film 1 and the copper oxide 2; a second sub-step of detecting an electrical signal containing information on the electrical resistance value of the contact area of the thin carbon film 1 with the copper oxide 2; and a third sub-step of verifying whether the detected electrical signal is an electrical signal that is to be obtained when the electrical resistance value has reached a predetermined value. In this case, the first sub-step, the second sub-step, and the third sub-step may be repeated in this order in the second step until the detected electrical signal is determined as the electrical signal that is to be obtained when the electrical resistance value has reached the predetermined value.

In another embodiment of the production method of the present disclosure, electrical bias application conditions under which the electrical resistance value of the contact area of the thin carbon film 1 with the copper oxide 2 reaches the predetermined value are preliminarily determined, and an electrical bias is applied between the thin carbon film 1 and the copper oxide 2 in accordance with the conditions. In this embodiment, a thin oxidized carbon film can be produced by performing the step S2 and the step S5 shown in FIG. 3 using the configuration shown in FIG. 1.

Figure 4:
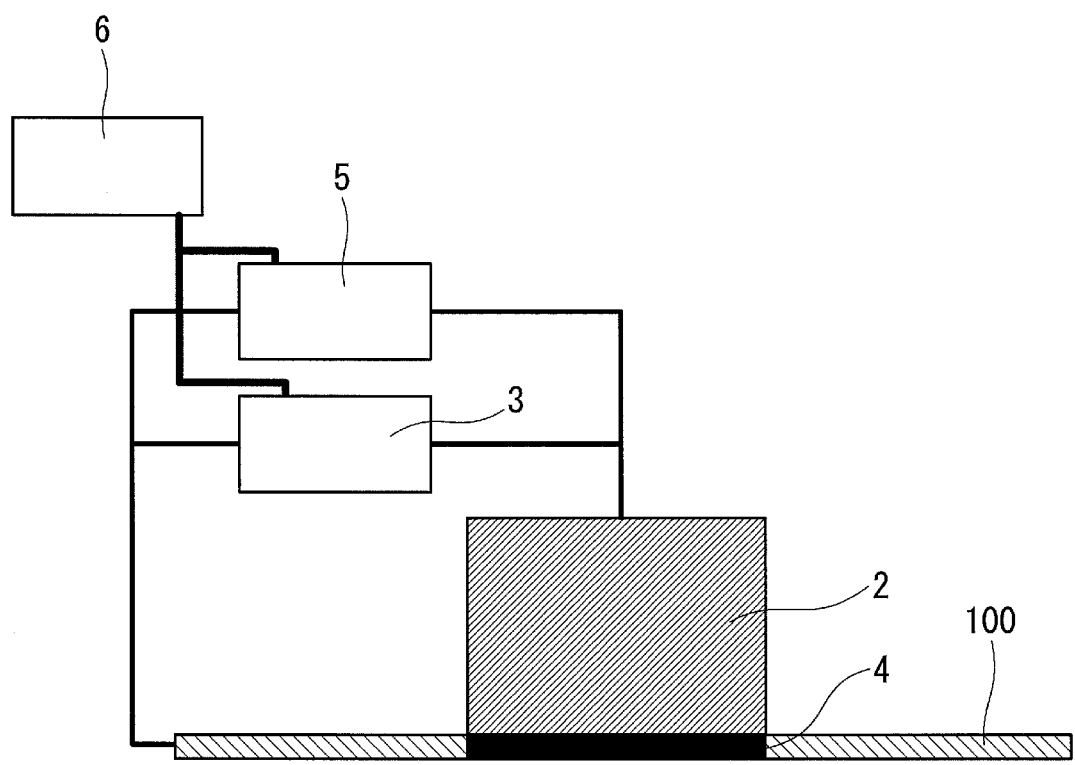
FIG. 4 is a schematic diagram showing an example of a thin oxidized carbon film produced using the configuration shown in FIG. 2 based on the method for producing a thin oxidized carbon film according to the present disclosure.

FIG. 4 shows a thin oxidized carbon film 100 formed by applying an electrical bias between the thin carbon film 1 and the copper oxide 2 using the configuration shown in FIG. 2. The thin oxidized carbon film 100 shown in FIG. 4 has an oxidized portion 4 composed of oxidized carbon in the contact area of the thin film with the copper oxide 2. When the thin carbon film 1 used is graphene, the oxidized portion 4 is composed of oxidized graphene. In the example shown in FIG. 4, the oxidized portion 4 occupies the whole thickness in the contact area of the thin oxidized carbon film 100.

The thin oxidized carbon film 100 shown in FIG. 4 can be formed by application of an electrical bias between the thin carbon film 1 and the copper oxide 2. The electrical bias application is performed, for example, in accordance with the flowchart shown in FIG. 3. The process of the formation of the oxidized portion 4 can be monitored by the above-described information detected by the signal detecting unit 5.

The preparation of the thin carbon film 1 and the copper oxide 2 being contact with the thin film in the first step can be performed by a commonly-known thin film formation technique.

An element having a thin oxidized carbon film can be produced by use of the method for producing a thin oxidized carbon film according to the present disclosure (a method for producing an element according to the present disclosure). The element includes a substrate and a thin oxidized carbon film disposed on the substrate. The thin oxidized carbon film has an oxidized portion composed of oxidized carbon. In the element, for example, the oxidized portion patterned in the thin oxidized carbon film functions as an insulating portion, and/or the portion (non-oxidized portion) other than the patterned oxidized portion functions as an electrically-conductive portion and/or a semiconductor portion.

In the method for producing an element according to the present disclosure, a substrate, a thin carbon film 1 disposed on the substrate, and a copper oxide 2 containing a mixture of $Cu_2O$ and CuO are prepared in such a manner that the copper oxide 2 is in contact with the thin carbon film 1 at a position where an oxidized portion 4 is to be formed in the thin carbon film 1 (first step). For this purpose, for example, the copper oxide 2 may be deposited in contact with the thin film 1 in an area of the thin carbon film 1 where the oxidized portion 4 is to be formed. A commonly-known thin film formation technique and a commonly-known thin film fine processing technique can be employed for the deposition of the copper oxide 2.

Thereafter, a voltage or a current is applied between the thin carbon film 1 and the copper oxide 2 with the electrical potential of the thin carbon film 1 being positive, and thus the contact area of the thin carbon film 1 with the copper oxide 2 is oxidized and converted into the oxidized portion 4 to form the thin oxidized carbon film 100 having the oxidized portion 4 (second step). The details of the first and second steps are the same as the details of the first and second steps in the method for producing a thin oxidized carbon film according to the present disclosure.

The substrate is composed of a conductor or a semiconductor. The substrate is, for example, an n-doped or p-doped Si substrate. An insulating layer may be disposed between the substrate and the thin carbon film 1. The insulating layer is, for example, an oxide film such as a $SiO_2$ film (including thermally-oxidized Si), an $Al_2O_3$ film, and a $HfO_2$ film, a nitride film, or an organic film. Although depending on the intended use of the element, the insulating film is composed of, for example, a material that allows application of an electrical field between the substrate and the thin oxidized carbon film formed.

Figure 5:
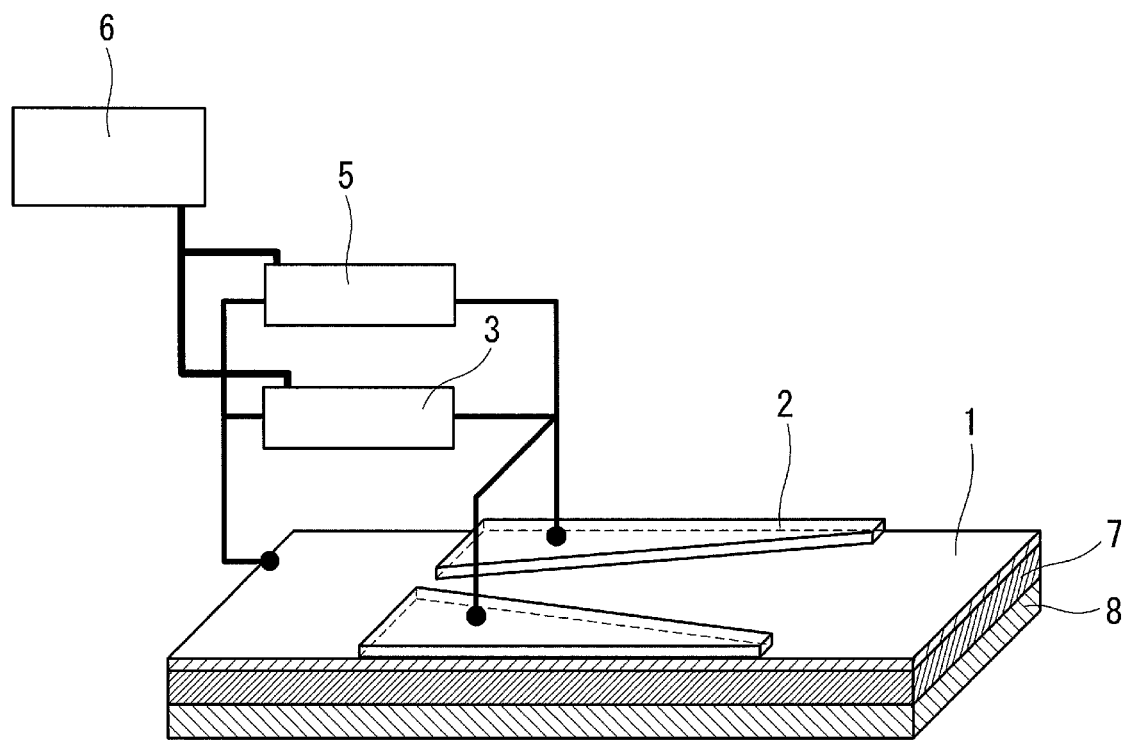
FIG. 5 is a schematic diagram showing an example of a configuration including a thin carbon film and a copper oxide and designed to carry out the method for producing an element according to the present disclosure.

The method for producing an element according to the present disclosure can be carried out, for example, using the configuration shown in FIG. 1 or FIG. 2 in accordance with the flowchart shown in FIG. 3. FIG. 5 shows an embodiment using the configuration shown in FIG. 2.

In the example shown in FIG. 5, a thin carbon film 1 is formed on a substrate 8 with an insulating layer 7 interposed therebetween. Copper oxides 2 containing a mixture of $Cu_2O$ and CuO are disposed on and in contact with the thin carbon film 1. An electrical bias is applied between the thin film 1 and the copper oxides 2 by the bias applying unit 3, and oxidized portions conforming to the arrangement of the copper oxides 2 are formed in the thin carbon film 1. Thus, an element including a thin oxidized carbon film having oxidized portions is formed. The oxidized portions can be formed in a pattern.

Figure 6:
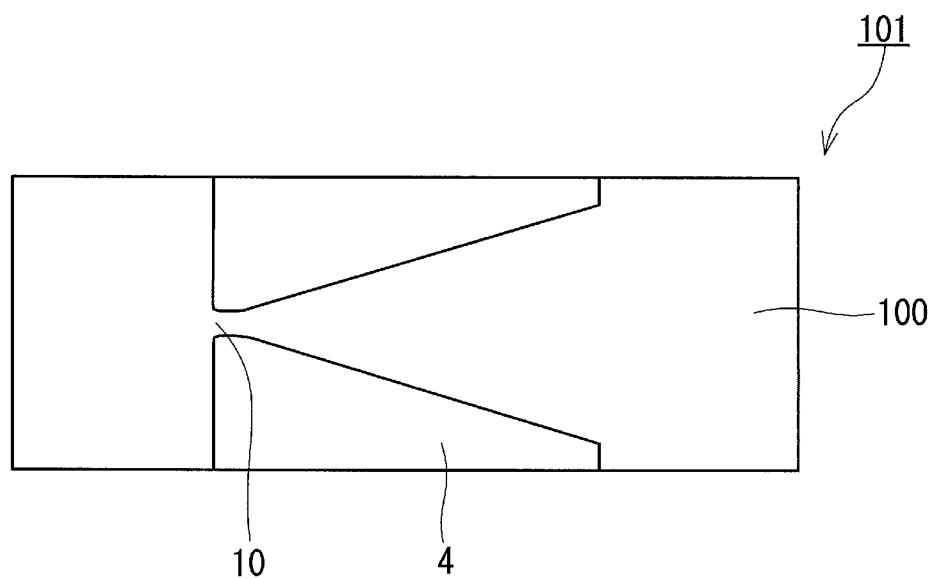
FIG. 6 is a plan view schematically showing an example of an element having a thin oxidized carbon film and fabricated by the method for producing an element according to the present disclosure.

FIG. 6 shows an element 101 formed in the example shown in FIG. 5. FIG. 6 is a diagram of the element 101 viewed in a direction perpendicular to the principal surface of the thin oxidized carbon film 100. The element 101 includes the thin oxidized carbon film 100 in which the oxidized portions 4 are formed in the shapes of the copper oxides 2. In the element 101, the oxidized portions 4 function as insulating portions. The thin oxidized carbon film 100 has a portion other than the oxidized portions 4, and the other portion is an non-insulating portion composed of carbon. The non-insulating portion has a narrow portion 10 lying between the pair of oxidized portions (insulating portions) 4 when viewed in a direction perpendicular to the principal surface of the thin oxidized carbon film 100. When the thin carbon film 1 used is graphene, the narrow portion 10 may function as a semiconductor depending on the smallest width of the narrow portion 10. In order for the narrow portion 10 to function as a semiconductor, the smallest width of the narrow portion 10 is, for example, 10 nm or less. The method for producing an element according to the present disclosure allows such fine patterning on the thin carbon film 1 as exemplified by graphene. In the example shown in FIG. 6, the copper oxides 2 are removed after formation of the oxidized portions 4.

Figure 7:
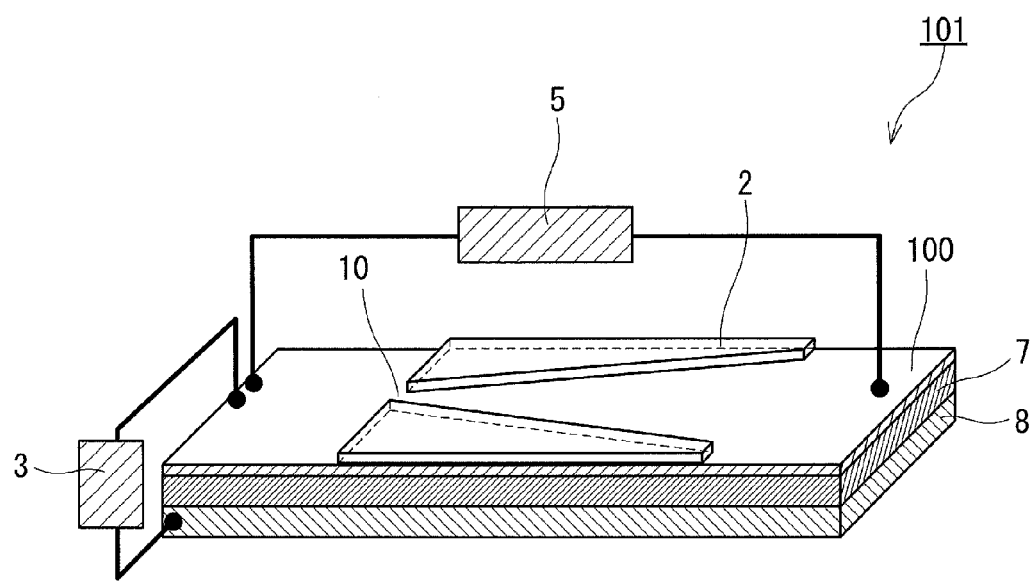
FIG. 7 is a perspective view schematically showing an example of an element having a thin oxidized carbon film and fabricated by the method for producing an element according to the present disclosure.

FIG. 7 shows an example of the thus-formed element of the present disclosure. The element 101 shown in FIG. 7 includes: the substrate 8; the thin oxidized carbon film 100 disposed on the substrate 8 and having oxidized portions (insulating portions) 4 composed of oxidized carbon and an non-insulating portion composed of carbon; the insulating layer 7 disposed between the substrate 8 and the thin oxidized carbon film 100; and the copper oxides 2 containing a mixture of $Cu_2O$ and $CuO$ and disposed on a surface of the thin oxidized carbon film 100 that is opposite to a surface facing the insulating layer 7, the copper oxides 2 being in contact with the insulating portions of the thin oxidized carbon film 100. The non-insulating portion has the narrow portion 10 bounded by the insulating portions 4 when viewed in a direction perpendicular to the principal surface of the thin oxidized carbon film 100. The electrical conductivity of the non-insulating portion via the narrow portion 10 in the in-plane direction of the thin oxidized carbon film 100 is variable by application of an electrical field between the substrate 8 and the thin oxidized carbon film 100. This element (thin carbon film element) can function as a field-effect device, such as a transistor, in which the value of a current flowing in the device is variable by an electrical field.

In the element 101, an electrical field is applied between the substrate 8 and the thin oxidized carbon film 100 using the bias applying unit 3. The value of a current flowing in the non-insulating portion via the narrow portion 10 is detected using the signal detecting unit 5.

In order for the element 101 to function as a field-effect device, the smallest width of the narrow portion 10 in the element 101 is, for example, 10 nm or less.

Any layer can be disposed on the thin carbon film 100 as necessary.

EXAMPLES

Hereinafter, the exemplary embodiments will be described in more detail using examples.

Example 1

First, multi-layer graphene serving as a thin carbon film 1 was prepared by reference to Science, vol. 306, p. 666-p. 669 (2004). Specifically, a cellophane adhesive tape was pressed against a 1 mm-thick highly oriented pyrolytic graphite (HOPG) to exfoliate a crystalline flake. A cellophane adhesive tape was further pressed against the exfoliated crystalline flake to exfoliate a part of the crystalline flake and thus to obtain a thinner flake. The operation of exfoliating a part of an obtained flake with a cellophane adhesive tape was repeated a plurality of times, and then the resultant HOPG flake on an adhesive tape was rubbed onto a substrate made of magnesium oxide (MgO). When the thickness of the thin carbon film 1 on the MgO substrate was evaluated using an atomic force microscope (AFM), the thickness was about 1±0.5 nm. This thickness corresponds to the total thickness of several carbon atom layers. It was separately confirmed that the same result can be obtained also in the case of using a substrate composed of a material other than MgO as long as the substrate has a strength sufficient for disposing a flake. In addition, it was separately confirmed that HOPG having a thickness of about several micrometers does not require use of a substrate.

Next, a copper oxide 2 was deposited by pulsed laser deposition in a 30 μm×30 μm region of a surface of the thin carbon film 1. The deposition of the copper oxide 2 was performed as follows: a silicon oxide ($SiO_2$) film having an opening with a size of 30 μm×30 μm and a metal mask having an opening with a size of 200 μm×200 μm were respectively formed and disposed in this order on the thin carbon film 1 (the centers of the two openings coincided with each other when viewed in a direction perpendicular to the principal surface of the thin carbon film 1), and the copper oxide 2 was deposited from above the $SiO_2$ film and the metal mask.

A CuO sintered body having a size of 20 mm diameter×5 mm thickness was used as the target for the deposition of the copper oxide 2, and an excimer laser (KrF laser with a wavelength of 248 nm) was used as the laser for the deposition. The deposition of the copper oxide 2 was carried out at a substrate temperature of 100 to 500° C. (typically 400° C.) with a target irradiation power density of 4 to 10 $J/cm^2$ (typically 6 $J/cm^2$) in an atmosphere of $10^{-1}$ to $10^{-5}$ Pa created by flow of oxygen gas into a vacuum atmosphere whose pressure had once reached $10^{-5}$ to $10^{-6}$ Pa (typically, an atmosphere of $2\times10^{-2}$ Pa created by an oxygen gas flow at a rate of 2 sccm). The unit "sccm" of the oxygen gas flow rate means "standard cc/min", and represents a volume of a gas flowing per minute under the standardized conditions of a pressure of 1 atom and a temperature of 0° C. The copper oxide 2 was deposited with a design film thickness of 1 nm or more and 50 nm or less (typically 5 nm) calculated from the film formation rate. The shape of the deposited copper oxide 2 was the same as that of the opening of the $SiO_2$ film when viewed in a direction perpendicular to the principal surface of the thin carbon film 1.

Figure 8:
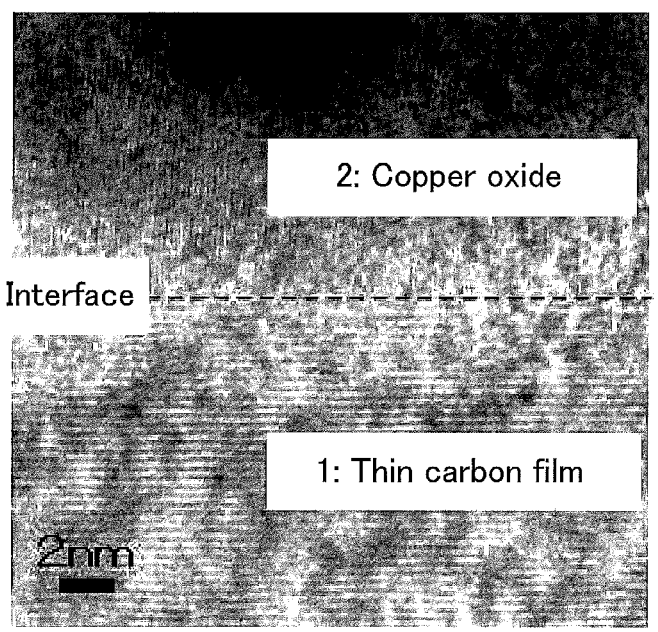
FIG. 8 is an image showing a cross-section evaluated in Examples, the cross-section being taken at the vicinity of a junction interface between a thin carbon film made of multilayer graphene and a thin copper oxide film formed on the thin carbon film.

A thin copper oxide film (of about 100 nm thickness) was separately formed on a MgO substrate under the same deposition conditions as above, and the structure of the thin film was evaluated by X-ray diffraction and Raman spectroscopic analysis. It was found that the thin film was composed of a mixed polycrystal (Cu—O) of $Cu_2O$ and CuO. FIG. 8 shows a cross-section (a cross-sectional image taken by a transmission electron microscope (TEM)) of the vicinity of a junction interface between a thin carbon film (of about 100 nm thickness) made of multi-layer graphene and a thin copper oxide film separately formed on the thin carbon film under the same deposition conditions as above. As shown in FIG. 8, the thin carbon film and the thin copper oxide film were joined together with an abrupt interface.

Next, a ruthenium (Ru) layer (of 50 nm thickness) was further deposited as an electrode on the deposited copper oxide 2.

Next, a bias applying unit 3 and a signal detecting unit 5 were electrically connected to the thin carbon film 1 and the copper oxide 2, in order to apply an electrical bias to the copper oxide 2 via the deposited Ru electrode and in order to detect the electrical resistance value of the contact area of the thin carbon film 1 with the copper oxide 2. Pulse generator 81110A manufactured by Agilent Technologies was used as the bias applying unit 3. Source meter 2425 manufactured by Keithley Instruments was used as the signal detecting unit 5.

Next, an electrical bias was applied to the thin carbon film 1 and the copper oxide 2 in accordance with the flowchart shown in FIG. 3, and thus an oxidized portion 4 was formed in the thin carbon film 1. The applied electrical bias was a pulse voltage having a pulse width of 1 μs and generating an electrical potential difference of 3.5 V between the thin carbon film 1 and the copper oxide 2 (the electrical potential of the thin carbon film 1 was positive). The electrical resistance value of the contact area of the thin carbon film 1 with the copper oxide 2 was increased by the electrical bias application. This phenomenon was judged as occurrence of resistance change, and is expressed as "Occurred" in Table 1 given below. The parenthesized values in "Sample configuration" in the below-given tables including Table 1 represent the film thicknesses.

TABLE 1

| Sample | Sample configuration | Applied electrical bias | Resistance change |
| --- | --- | --- | --- |
| 1-1 | Thin carbon film 1/ Copper oxide 2 (5 nm)/ Ru electrode (50 nm) | Pulse voltage (Potential difference: 3.5 V, Pulse width: 1 μs) | Occurred |

Figure 9:
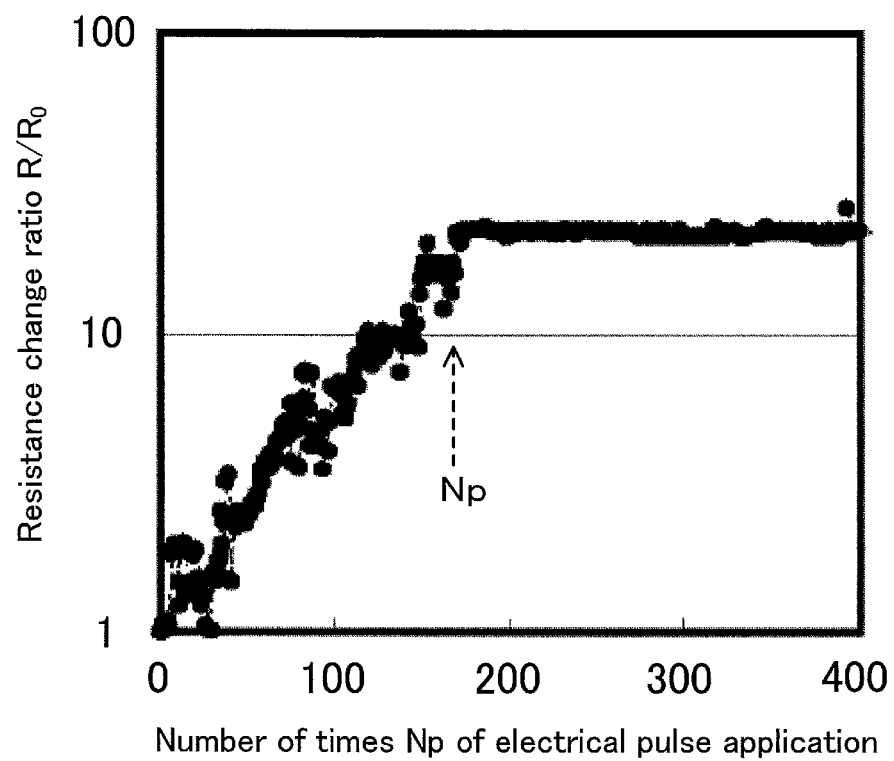
FIG. 9 is a graph showing an example of the change in electrical resistance value with respect to the number of times of electrical pulse application in the case where an electrical bias in the form of a pulse (electrical pulse) is applied between a thin carbon film and a copper oxide in Examples.

FIG. 9 shows the change in electrical resistance value caused by electrical bias application in Sample 1-1. In FIG. 9, electrical resistance values R measured for every electrical pulse application are shown by the ratios (resistance change ratios $R/R_0$) with respect to an electrical resistance value (initial resistance value) $R_0$ measured before the electrical bias application. As shown in FIG. 9, formation of an oxidized portion (oxidized graphene) by electrical bias application was detected as an increase in the resistance change ratio $R/R_0$ associated with an increase in the number of times of the electrical pulse application. When the number of times Np of the electrical pulse application reached about 170, the electrical resistance value sharply increased (the vertical axis in FIG. 9 represents logarithmic values), and thereafter, the resistance change ratio $R/R_0$ was maintained at an approximately constant value despite the further electrical pulse application. This behavior can be understood as the same behavior as observed in the case where a constant voltage is applied to a plurality of resistances connected in parallel and where the resistance value of each of the resistances connected in parallel gradually increases (each of the resistances becomes highly resistive), and the total resistance sharply increases at the moment when the last-connected resistance becomes highly resistive. When an electrical pulse was applied in the same manner as above except that the electrical potential of the thin carbon film 1 was negative, the resistance change (increase in electrical resistance value) as shown in FIG. 9 was not caused even by 1000 or more times of electrical pulse application.

The change of the thin carbon film 1 shown in FIG. 9 was observed by Raman spectroscopic analysis as an increase in the D band (about 1350 cm$^{-1}$) peak resulting from a defect induced by the change.

The results similar to those obtained for Sample 1-1 were obtained also when the design film thickness of the copper oxide 2 was varied in the range of 1 nm to 50 nm, and when the area of the junction portion at which the thin carbon film 1 and the copper oxide 2 were in contact with each other was varied in the range of 1 μm$^2$ to 2500 μm$^2$.

The results as obtained for Sample 1-1 were obtained only when electrons flowed to the thin carbon film 1 from the Cu—O, i.e., the copper oxide 2. It was inferred that the oxidized portion 4 in the thin carbon film 1 was formed by oxidation reaction of carbon caused by transfer of oxygen ions of the Cu—O to graphene. Examples of the reactions thought to proceed include the following reactions. One reaction is a reaction contributed to by oxygen contained in the $Cu_2O$ phase, and is represented by the reaction formula $Cu_2O+C \rightarrow 2Cu+CO$. Another reaction is a reaction contributed to by excess oxygen contained in the $Cu_2O$ phase, and is represented by $Cu_2O_{(1+\delta)}+\delta C \rightarrow Cu_2O+\delta CO$. Another reaction is a reaction contributed to by oxygen contained in the CuO phase, and is represented by $2CuO+C \rightarrow Cu_2O+CO$.

In order to confirm the above, the changes of the thin carbon film 1 and the copper oxide 2 before and after electrical bias application were evaluated as follows. First, a stack of a MgO substrate, a thin carbon film 1, and a copper oxide 2 was formed in the same manner as above, except that the thin carbon film 1 had a larger thickness (about 10 nm) than that in Sample 1-1, and that the design film thickness of the copper oxide 2 was about 25 nm. Next, the oxygen distribution in the vicinity of the junction interface between the thin carbon film 1 and the copper oxide 2 in the formed stack was evaluated by electron energy loss spectroscopy (EELS) on a cross-sectional image observed by a transmission electron microscope. Next, the same electrical bias as the electrical bias applied to Sample 1-1 was applied to the formed stack until the resistance change ratio $R/R_0$ exhibited by the stack was increased to and fixed at a constant value. As a result of the electrical bias application, the stack exhibited a change in the resistance change ratio $R/R_0$ similar to that of Sample 1-1. Next, the oxygen distribution in the vicinity of the junction interface between the thin carbon film 1 and the copper oxide 2 in the stack having been subjected to the electrical bias application was evaluated in the same manner as above. In EELS, a peak derived from oxygen is observed at a position corresponding to an energy loss of 545 eV. It was confirmed that signals corresponding to the peak, which were distributed uniformly in the copper oxide 2 and not present in the thin carbon film 1 before the electrical bias application, were concentrated to the junction interface between the copper oxide 2 and the thin carbon film 1 by the electrical bias application, and were spread into the thin carbon film 1.

One of the possible reasons why oxygen was transferred from the copper oxide 2 to the thin carbon film 1 to promote oxidation of the thin film 1 when an electrical bias was applied with the electrical potential of the thin carbon film 1 being positive, is that the difference between the Gibbs free energy for oxidation of carbon and the Gibbs free energy for oxidation of Cu into $Cu_2O$ (or oxidation of $Cu_2O$ into CuO) is negative in a wide range of temperatures. When the free energy difference is negative, oxidation of carbon is more stable than oxidation of copper oxide. The Ellingham diagram showing the free energies of various oxides indicates that oxidation of carbon is stable at a temperature of 100° C. or more. In view of the fact that a local high heat was generated by electrical bias application to the thin carbon film 1 and the copper oxide 2, the aforementioned stability of oxidation of carbon is qualitatively consistent with the result of the present example in which oxidation of the thin carbon film 1 was promoted during electrical bias application. That is, the result of the present example is thought to be achieved, first of all, by establishment of a favorable relationship between the thin carbon film 1 and the copper oxide 2.

Comparative Example 1

In Comparative Example 1, formation of a thin oxidized carbon film was attempted using a 5 nm-thick magnesium oxide (MgO) film instead of the copper oxide 2 (Sample 1-A). Sample 1-A was fabricated in the same manner as for Sample 1-1 of Example 1, except that MgO was deposited instead of the copper oxide 2. The deposition of MgO was performed by pulsed laser deposition using a MgO sintered body with a size of 20 mm diameter×2 mm thickness as the target and using an excimer laser (KrF laser with a wavelength of 248 nm) as the laser. The deposition conditions were that the substrate temperature was a room temperature to 300° C. (typically a room temperature), the atmosphere was a vacuum atmosphere of $10^{-5}$ to $10^{-6}$ Pa accompanied with no oxygen gas flow, and the target irradiation power density was 4 to 10 J/cm² (typically 6 J/cm²). The thickness of the deposited MgO film was calculated from the film formation rate. As in the case of Sample 1-1 in which the copper oxide 2 was deposited, a Ru layer (of 50 nm thickness) was further deposited (as an electrode) on the MgO for the purpose of improving electrical contact with the bias applying unit 3 and the signal detecting unit 5.

To the thus-formed stack of the thin carbon film and the MgO, a voltage pulse having a pulse width of 1 μs and generating an electrical potential difference of 3.5 V between the thin carbon film 1 and the MgO (the electrical potential of the thin carbon film 1 was positive) was applied. However, despite repeated application of the voltage pulse, the electrical resistance value of the contact area of the thin carbon film 1 with the MgO was not changed. This phenomenon was judged as non-occurrence of resistance change, and is expressed as "Not occurred" in Table 2 given below.

TABLE 2

| Sample | Sample configuration | Applied electrical bias | Resistance change |
|---|---|---|---|
| 1-A (Comparative Example) | Thin carbon film 1/ MgO (5 nm)/ Ru electrode (50 nm) | Pulse voltage (Potential difference: 3.5 V, Pulse width: 1 μs) | Not occurred |

The result shown in Table 2 was inferred to be derived from the fact that oxidation of Mg is more stable than oxidation of carbon in terms of the Gibbs free energy for oxidation. Specifically, the result is thought to be due to the fact that oxygen required for oxidation of the thin carbon film cannot be taken from MgO. The effect provided by the present disclosure, that is, the effect of allowing an oxidized portion to be patterned in the thin carbon film 1 by application of an electrical bias between the thin carbon film 1 and the copper oxide 2, was verified by Example 1 and Comparative Example 1.

Example 2 and Comparative Example 2

Depending on the oxygen gas flow rate at the time of deposition of the copper oxide 2, the ratio between the content of $Cu_2O$ and that of CuO in the deposited copper oxide 2 varies. In Example 2, samples for which the oxygen gas flow rate in the atmosphere for copper oxide deposition was varied were fabricated, and formation of thin oxidized carbon films was attempted. Five samples (Samples 2-1 to 2-5) fabricated as Example 2 and one sample (Sample 2-A) fabricated as Comparative Example 2 were each fabricated in the same manner as for Sample 1-1 of Example 1, except that the oxygen gas flow rate in the atmosphere for copper oxide deposition was set to the value shown in Table 3 given below, and that the size of a junction portion between a thin carbon film and a copper oxide deposited on the thin film was 10 μm×10 μm. Next, to each of the thus-formed stacks consisting of a thin carbon film and a copper oxide, a voltage pulse having a pulse width of 1 μs and generating an electrical potential difference of 3.5 V between the thin carbon film and the copper oxide (the electrical potential of the thin carbon film was positive) was applied. In this manner, formation of thin oxidized carbon films was attempted. The results are shown in Table 3 given below.

TABLE 3

| Sample | Sample configuration | Oxygen flow rate (sccm) | Applied electrical bias | Resistance change |
|---|---|---|---|---|
| 2-1 | Thin carbon film 1/Copper oxide (5 nm)/Ru electrode (50 nm) | 10 | Pulse voltage (Potential difference: 3.5 V, Pulse width: 1 μs) | Occurred |
| 2-2 | | 5 | | Occurred |
| 2-3 | | 2 | | Occurred |
| 2-4 | | 1 | | Occurred |
| 2-5 | | 0.5 | | Occurred |
| 2-A (Comparative Example) | | 0 | | Not occurred |

As a result of the electrical bias application, Samples 2-1 to 2-5 exhibited changes in the resistance change ratio $R/R_0$ similar to that of Sample 1-1. This phenomenon was judged as occurrence of resistance change, and is expressed as "Occurred" in "Resistance change" of Table 3. On the other hand, in Sample 2-A, despite repeated application of the voltage pulse, the electrical resistance value of the contact area of the thin carbon film with the copper oxide was not changed, and the resistance change ratio $R/R_0$ was not changed. This phenomenon was judged as non-occurrence of resistance change, and is expressed as "Not occurred" in "Resistance change" of Table 3.

Figure 10:
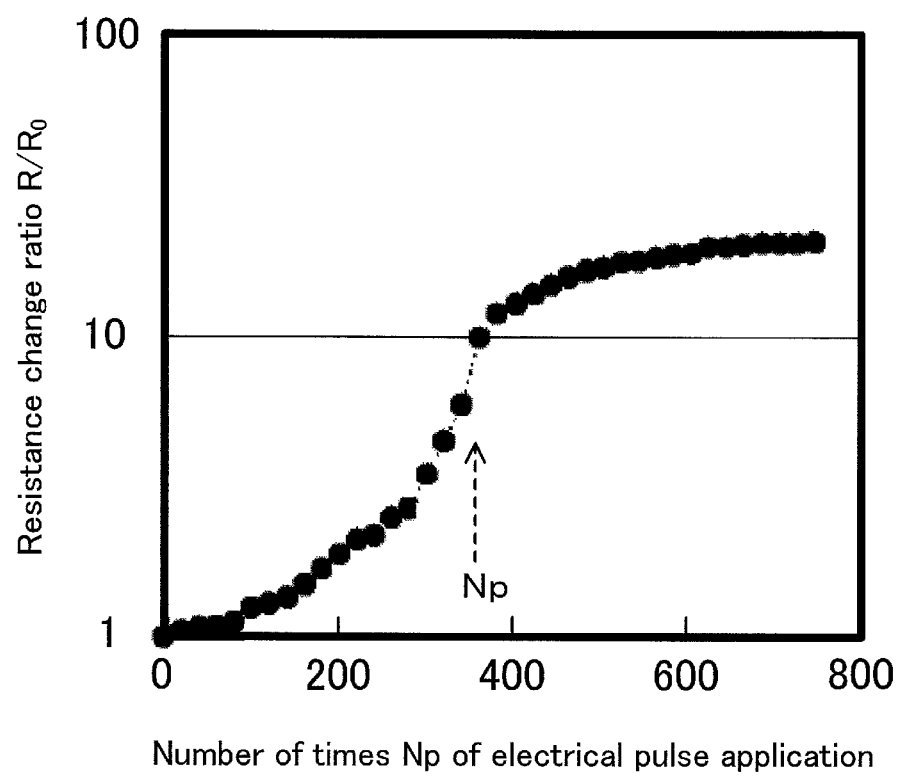
FIG. 10 is a graph showing an example of the change in electrical resistance value with respect to the number of times of electrical pulse application in the case where an electrical pulse is applied between a thin carbon film and a copper oxide in Examples.

FIG. 10 shows the change in electrical resistance value caused by electrical bias application in Sample 2-5. In FIG. 10, electrical resistance values measured for every 20 times of electrical pulse application are shown by the resistance change ratios $R/R_0$ as in FIG. 9. As shown in FIG. 10, in Sample 2-5 for which the oxygen gas flow rate in the atmosphere for copper oxide deposition was set to 0.5 sccm, the following changes in electrical resistance value that are characteristic of formation of an oxidized portion were observed: an increase in the resistance change ratio $R/R_0$ associated with an increase in the number of times of electrical pulse application; and a sharp increase in the resistance change ratio $R/R_0$ at the moment when the number of times Np of electrical pulse application reached about 360.

On the other hand, in Sample 2-A for which the oxygen gas flow rate in the atmosphere for copper oxide deposition was set to 0 sccm, the change in electrical resistance value as shown in FIG. 10 (the change in electrical resistance value characteristic of formation of an oxidized portion) was not caused even by 1000 or more times of electrical pulse application. When the crystal structure of the copper oxide in Sample 2-A was evaluated by X-ray diffraction (XRD), the Cu phase, albeit slight, was observed in addition to the $Cu_2O$ phase. It was inferred that, in Sample 2-A, effective electrical field application to the copper oxide was hindered by short circuit between the Ru electrode and the thin carbon film through this Cu phase, and thus an oxidized portion was not formed. Each of the copper oxides in Samples 2-1 to 2-5 was composed of a mixed polycrystal (Cu—O) of $Cu_2O$ and CuO.

Example 3

In Example 3, the change in the resistance change ratio $R/R_0$ caused by the change in the applied electrical bias was evaluated using Sample 2-5 fabricated in Example 2.

As the magnitude of the applied pulse voltage was increased from 3.5 V, the number of times Np of electrical pulse application, at which the resistance change ratio $R/R_0$ sharply changes, was decreased from 360. On the other hand, as the magnitude of the applied pulse voltage was decreased from 3.5 V, the Np was increased. In the case where the magnitude of the applied pulse voltage was fixed at 3.5 V, the Np was increased when the pulse width was reduced from 1 μs, while the Np was decreased when the pulse width was increased. Furthermore, also when a constant voltage of 3.5 V was applied using a direct current power supply, a sharp change in the resistance change ratio $R/R_0$ was observed, and the bias application time to the sharp change in the resistance change ratio $R/R_0$ was also significantly reduced, compared to the total time (360 μs) of Np times of application of a pulse voltage having a pulse width of 1 μs. These results indicated that the power for feed of the applied electrical bias and the Joule heat generated by the electrical bias application are involved with the formation of the thin oxidized carbon film according to the present disclosure. In addition, it was found from Example 3 that the formation of the thin oxidized carbon film can be controlled by control of the conditions for electrical bias application.

Example 4

In Example 4, the element shown in FIG. 7 was fabricated using the configuration shown in FIG. 5.

First, a thin carbon film 1 was prepared as in Example 1. It should be noted that a HOPG flake on an adhesive tape was rubbed onto a p-doped Si substrate in such a manner that the HOPG flake contacted with a thermally-oxidized Si film (of 300 nm thickness) formed on the surface of the substrate. The Si substrate corresponds to the substrate 8 of FIGS. 5 and 7, and the thermally-oxidized Si film corresponds to the insulating layer 7.

Next, copper oxides 2 were deposited with a design film thickness of 5 nm on the surface of the thin carbon film 1 by pulsed laser deposition. The specific method and conditions for the deposition of the copper oxides 2 were the same as those for Sample 1-1 (the oxygen gas flow rate in the deposition atmosphere was 2 sccm). The deposited copper oxides 2 were shaped in such a manner that, as shown in FIGS. 5 to 7, the thin carbon film 1 had a narrow portion 10 having a smallest width of 10 nm (an exposed portion of the thin carbon film 1 that lies between the pair of copper oxides 2) when viewed in a direction perpendicular to the principal surface of the thin carbon film. The pair of copper oxides 2 had the same wedge shape when viewed in said direction. The pair of copper oxides 2 were deposited in such a manner that they were symmetrical to each other in their longitudinal direction. When the thin carbon film 1 on which the copper oxides 2 had been deposited was viewed in the direction perpendicular to its principal surface, it was found that an exposed portion of the thin carbon film 1 that narrowed gradually in the longitudinal direction of the pair of copper oxides 2 and that had the narrow portion 10 at its end was formed between the copper oxides 2. For the deposition of the copper oxides 2 thus shaped and arranged, a mask was used that was made of an inorganic polymer HSQ (Hydrogen Silsesquioxane) usable as a resist for electron beam lithography and that had openings conforming to the shapes and positions of the copper oxides 2 to be deposited.

Next, a Ru layer (of 50 nm thickness) was further deposited on the copper oxides 2 as in Example 1, for the purpose of improving the electrical contact with a bias applying unit 3 and a signal detecting unit 5.

Next, a bias applying unit 3 and a signal detecting unit 5 were electrically connected to the thin carbon film 1 and the copper oxides 2, in order to apply an electrical bias to the copper oxides 2 via the deposited Ru electrode and in order to detect the electrical resistance value of the contact area of the thin carbon film 1 with the copper oxides 2. Pulse generator 81110A manufactured by Agilent Technologies was used as the bias applying unit 3. Source meter 2425 manufactured by Keithley Instruments was used as the signal detecting unit 5.

Next, an electrical bias was applied to the thin carbon film 1 and the copper oxides 2 in accordance with the flowchart shown in FIG. 3, and thus oxidized portions 4 were formed in the thin carbon film 1. The applied electrical bias was a pulse voltage having a pulse width of 1 μs and generating an electrical potential difference of 3.5 V between the thin carbon film 1 and the copper oxides 2 (the electrical potential of the thin carbon film 1 was positive). The electrical resistance value of the contact area of the thin carbon film 1 with the copper oxides 2 was increased by the electrical bias application. This phenomenon was judged as occurrence of resistance change, and is expressed as "Occurred" in Table 4 given below.

TABLE 4

| Sample | Sample configuration | Applied electrical bias | Resistance change |
|---|---|---|---|
| 4-1 | Thin carbon film 1/ Copper oxides 2 (5 nm)/ Ru electrode (50 nm) | Pulse voltage (Potential difference: 3.5 V, Pulse width: 1 μs) | Occurred |

Next, a bias applying unit 3 was electrically connected so as to allow application of a voltage between the Si substrate 8 and the thin carbon film 1, and a signal detecting unit 5 was electrically connected to the thin carbon film 1 so as to allow detection of a current flowing in the plane of the thin carbon film 1 via the narrow portion 10. Then, a voltage was applied between the Si substrate 8 and the thin carbon film 1 using the substrate 8 as a gate electrode, and the corresponding change in the current flowing in the plane of the thin carbon film 1 via the narrow portion 10 was evaluated. Semiconductor parameter analyzer 4156C manufactured by Agilent Technologies was used as each of the bias applying unit 3 and the signal detecting unit 5.

When the gate voltage applied between the Si substrate 8 and the thin carbon film 1 was varied from 0 V to 50 V, the current flowing in the plane of the thin carbon film 1 via the narrow portion 10 was accordingly changed at least by one or more orders of magnitude. That is, the element fabricated in Example 4 was a thin carbon film element that can function as a field-effect device.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The method for producing a thin oxidized carbon film according to the present disclosure can be implemented by applying an electrical bias to a thin carbon film and a copper oxide being in contact with the thin carbon film, and thereby modifying the properties of the thin film (forming an oxidized portion in the thin film). This production method has good compatibility with semiconductor processes, and is widely applicable as a basic process technique for producing electronic devices.

What is claimed is:

1. A method for producing a thin oxidized carbon film, comprising:
   a first step of preparing a thin carbon film and a copper oxide being in contact with the thin carbon film and containing a mixture of $Cu_2O$ and $CuO$; and
   a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into an oxidized portion composed of oxidized carbon so as to form a thin oxidized carbon film having the oxidized portion.

2. The method for producing a thin oxidized carbon film according to claim 1, wherein the thin carbon film is single-layer graphene or multi-layer graphene.

3. The method for producing a thin oxidized carbon film according to claim 1, wherein, in the second step, a pulse voltage or a pulse current is applied between the thin carbon film and the copper oxide.

4. The method for producing a thin oxidized carbon film according to claim 1, wherein the second step comprises: a first sub-step of applying the voltage or the current between the thin carbon film and the copper oxide; a second sub-step of detecting an electrical signal containing information on an electrical resistance value of the contact area of the thin carbon film with the copper oxide; and a third sub-step of verifying whether the detected electrical signal is an electrical signal that is to be obtained when the electrical resistance value has reached a predetermined value.

5. The method for producing a thin oxidized carbon film according to claim 4, wherein the first sub-step, the second sub-step, and the third sub-step are repeated in this order in the second step until the detected electrical signal is determined as the electrical signal that is to be obtained when the electrical resistance value has reached the predetermined value.

6. A method for producing an element having a thin oxidized carbon film, the element including a substrate and a thin oxidized carbon film disposed on the substrate and having an oxidized portion composed of oxidized carbon, the method comprising:
   a first step of preparing the substrate, a thin carbon film disposed on the substrate, and a copper oxide containing a mixture of $Cu_2O$ and $CuO$, in such a manner that the copper oxide is in contact with the thin carbon film at a position where the oxidized portion is to be formed in the thin carbon film; and
   a second step of applying a voltage or a current between the thin carbon film and the copper oxide, with an electrical potential of the thin carbon film being positive relative to that of the copper oxide, and thereby oxidizing and converting a contact area of the thin carbon film with the copper oxide into the oxidized portion so as to form a thin oxidized carbon film having the oxidized portion.

7. An element having a thin oxidized carbon film, comprising:
   a substrate composed of a conductor or a semiconductor;
   a thin oxidized carbon film disposed on the substrate and having an insulating portion composed of oxidized carbon and a non-insulating portion composed of carbon;
   an insulating layer disposed between the substrate and the thin oxidized carbon film; and
   a copper oxide containing a mixture of $Cu_2O$ and $CuO$ and disposed on a surface of the thin oxidized carbon film that is opposite to a surface facing the insulating layer, the copper oxide being in contact with the insulating portion, wherein
   the non-insulating portion has a narrow portion bounded by the insulating portion when viewed in a direction perpendicular to a principal surface of the thin oxidized carbon film, and
   an electrical conductivity of the non-insulating portion via the narrow portion in an in-plane direction of the thin oxidized carbon film is variable by application of an electrical field between the substrate and the thin oxidized carbon film.

* * * * *